(12) United States Patent
Ashizawa

(10) Patent No.: US 6,917,538 B2
(45) Date of Patent: Jul. 12, 2005

(54) STATIC SEMICONDUCTOR MEMORY DEVICE AND METHOD OF CONTROLLING THE SAME

(75) Inventor: Tetsuo Ashizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/638,436

(22) Filed: Aug. 12, 2003

(65) Prior Publication Data
US 2004/0042326 A1 Mar. 4, 2004

(30) Foreign Application Priority Data
Aug. 30, 2002 (JP) ........................................ 2002-253264

(51) Int. Cl.$^7$ ................................................ G11C 11/00
(52) U.S. Cl. .................. 365/154; 365/230.08; 365/365; 365/189.05
(58) Field of Search ........................... 365/154, 230.04, 365/230.08, 189.05, 189.08

(56) References Cited

U.S. PATENT DOCUMENTS

| | | | | |
|---|---|---|---|---|
| 5,717,648 A | * | 2/1998 | Davis et al. ............ | 365/230.06 |
| 5,973,985 A | * | 10/1999 | Ferrant ................... | 365/230.05 |
| 6,134,154 A | * | 10/2000 | Iwaki et al. ........... | 365/189.04 |
| 6,212,124 B1 | | 4/2001 | Noda | |
| 6,356,473 B1 | | 3/2002 | Shimoyama | |

FOREIGN PATENT DOCUMENTS

| | | |
|---|---|---|
| JP | 2001-298986 | 10/2000 |
| JP | 2001-67878 | 3/2001 |

* cited by examiner

Primary Examiner—Thong Q. Le
(74) Attorney, Agent, or Firm—Arent Fox PLLC

(57) ABSTRACT

A word line control circuit controls a high-level voltage value representing that a plurality of word lines are unselected in each of an access mode and non-access mode on the basis of a control signal for controlling the high-level voltage value of the word lines and a control signal output from a main decoder.

19 Claims, 7 Drawing Sheets

F I G. 1
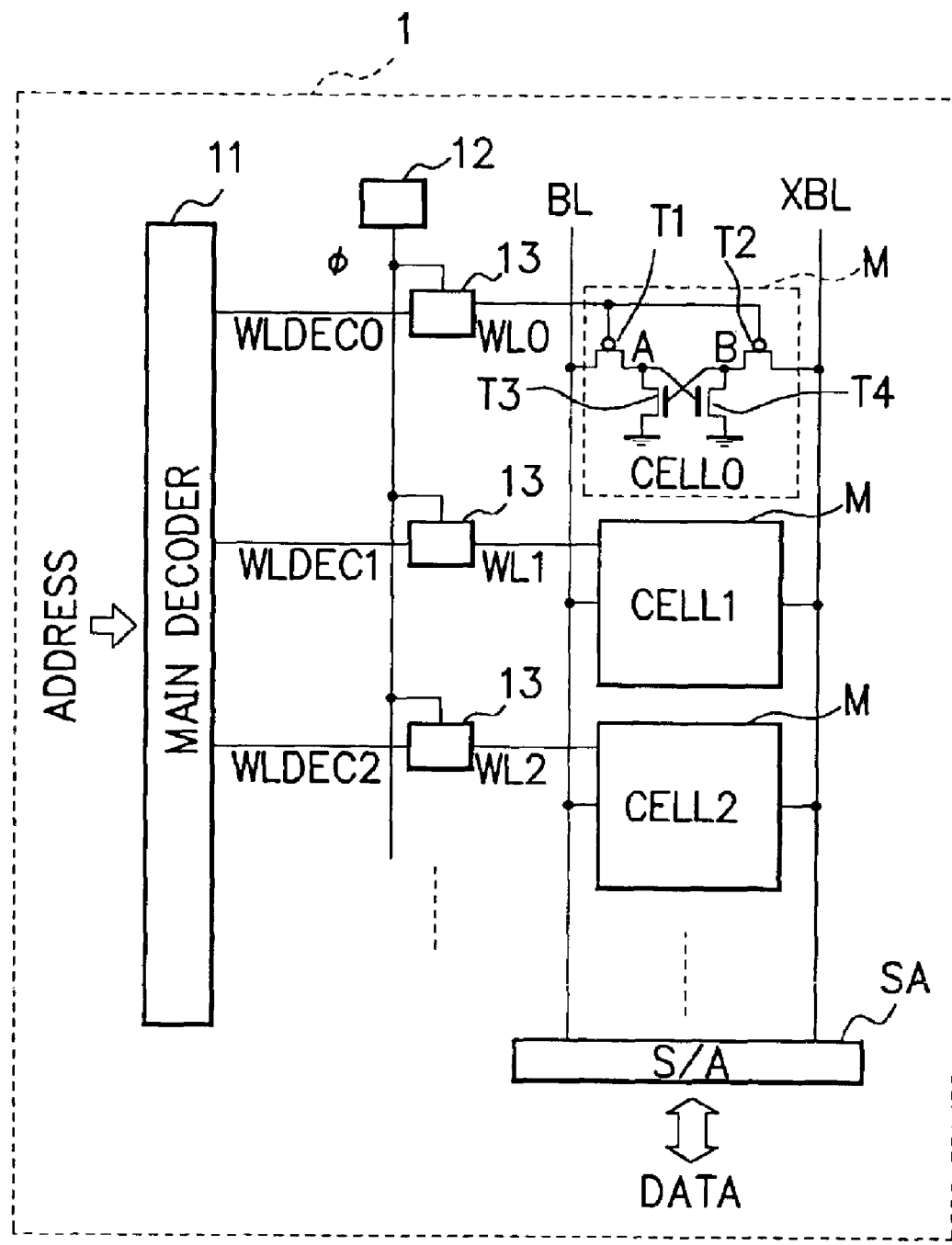

F I G. 4
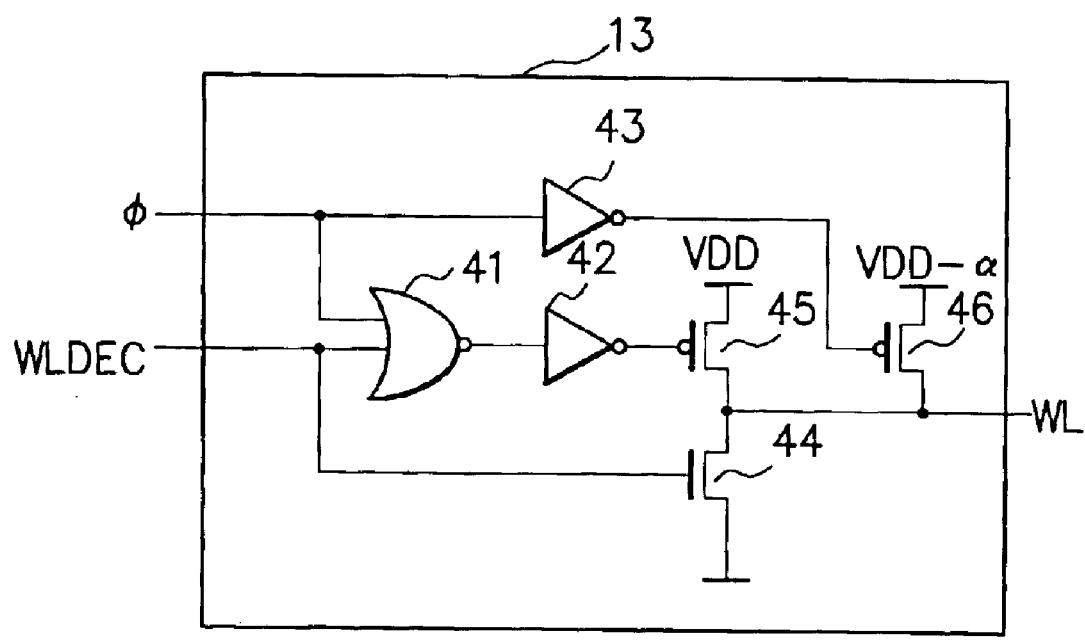

STATIC SEMICONDUCTOR MEMORY DEVICE AND METHOD OF CONTROLLING THE SAME

CROSS-REFERENCE TO RELATED APPLICATIONS

This application is based upon and claims the benefit of priority from the prior Japanese Patent Application No. 2002-253264, filed on Aug. 30, 2002, the entire contents of which are incorporated herein by reference.

BACKGROUND OF THE INVENTION

1. Field of the Invention

The present invention relates to a static semiconductor memory device and a method of controlling the same and, more particularly, to a static semiconductor memory device having memory cells each formed from four transistors and a method of controlling the same.

2. Description of the Related Art

A conventional example of a static semiconductor memory device having memory cells each formed from four transistors is an SRAM (Static Random Access Memory) having 4Tr (transistor) memory cells (the SRAM will be referred to as a 4Tr SRAM hereinafter). FIG. 6 is a view showing the schematic arrangement of the memory cell array of the conventional 4Tr SRAM and a leakage current in read operation. The memory cell array shown in FIG. 6 is constituted by arraying static memory cells each formed from four transistors in a matrix.

As shown in FIG. 6, in the 4Tr SRAM, 256 memory cells (CELL0, CELL1, . . . CELL255) M are connected to pairs of bit lines BL and XBL (for a 256-word structure). To select each memory cell M, word lines WL0, WL1, . . . , WL255 (to be referred to as word lines WL hereinafter) are connected in correspondence with the memory cells M. More specifically, a pair of bit lines BL and XBL arranged in correspondence with each column of the memory cell array and the word line WL arranged in correspondence with each row of the memory cell array are connected to each memory cell M.

The memory cell M is constituted by a pair of transfer transistors T1 and T2 formed from p-MOS (Metal-Oxide Semiconductor) FETs (Field-Effect Transistors) and a pair of driver transistors T3 and T4 formed from n-MOSFETs. A sense amplifier SA is connected to the bit lines BL and XBL. The sense amplifier SA amplifies the potential difference between data read out from the memory cell M to the bit lines BL and XBL in read operation and reads out the data. At the time of accessing the memory cell M, the bit lines BL and XBL have a complementary relationship. When one bit line is at high level, the other is at low level. When the memory cell M is not accessed, both the bit lines are precharged to high level.

The gate and drain terminals of the above-described driver transistors T3 and T4 are cross-connected to form a flip-flop. The source terminals are connected to ground. A cross-connection point to the drain terminal of the driver transistor T3 is defined as a node A. A cross-connection point to the drain terminal of the driver transistor T4 is defined as a node B. The node A is connected to the bit line BL through the transfer transistor T1. The node B is connected to the bit line XBL through the transfer transistor T2. The word line WL is connected to the gate terminals of the transfer transistors T1 and T2.

In the memory cells M having the above-described arrangement, to hold data in the above-described node A or B, the word lines WL of the unselected memory cells M are set at high level. At this time, to prevent the potential (H or L level) of the node A or B from changing due to the first leakage current that leaks through the driver transistors T3 and T4, the second leakage current of the transfer transistors T1 and T2 connected to the bit lines BL and XBL is controlled. The relationship between the above-described first leakage current and the second leakage current will be described below.

Examples of the first leakage current from the node A or B of the memory cells M are a junction leakage, transistor leakage, and gate leakage. The second leakage current is generated by the gate voltages of the transfer transistors T1 and T2 and the potential difference between the bit lines BL and XBL and the nodes A and B of the memory cells M. Along with the recent development of micropatterning process, the above-described first leakage current tends to increase.

To hold data in the node A or B, the second leakage current must be set to be much larger than the first leakage current. To do this, the manufacturing process is adjusted in consideration of the mass productivity and the like such that the second leakage current has a magnitude about 100 times larger than that of the first leakage current of the memory cells M. In addition, to improve the data holding characteristics in the node A or B, the value of the voltage to be supplied to the word lines WL connected to unselected memory cells M is set to VDD-α (VDD: power supply voltage value, and α: value about 10% of the power supply voltage) to increase the second leakage current of the transfer transistors T1 and T2.

The operation of the above-described 4Tr SRAM will briefly be described next.

1. Read Operation

During the non-access period for the memory cells M, the bit lines BL and XBL are precharged to high level. When data is to be read out from the selected memory cell M during the access period, the word line WL connected to the selected memory cell M is set to low level. Accordingly, the transfer transistors T1 and T2 are turned on, and data held in the memory cell M is output to the bit lines BL and XBL. The word lines WL connected to the unselected memory cells M are kept at high level so that their transfer transistors T1 and T2 are kept OFF. In addition, the second leakage current flows to the transfer transistors T1 and T2 of the unselected memory cells M in accordance with the potential of the gate terminal at high level.

2. Write Operation

During the non-access period for the memory cells M, the bit lines BL and XBL are precharged to high level. When data is to be written in the selected memory cell M during the access period, the word line WL connected to the selected memory cell M is set to low level. Accordingly, the transfer transistors T1 and T2 are turned on to connect the bit lines BL and XBL to the memory cell M, and data is written by the bit lines BL and XBL. At this time, the second leakage current flows to the transfer transistors T1 and T2 of the unselected memory cells M in accordance with the potential of the gate terminal at high level, as in the read operation.

In the above-described conventional setting method, to hold data in the node A or B of the memory cells M, the potential of the word lines WL are set to VDD-α to increase the second leakage current of the transfer transistors T1 and T2. However, this setting method has the following three problems.

1. Degradation in Read Characteristics

As shown in FIG. 6, the 256 memory cells M (CELL0 to CELL255) are connected to the bit lines BL and XBL. In this case, "0"-data is written in the memory cell M (CELL0), and "1"-data is written in the memory cells M (CELL1 to CELL255). At this time, the node A of the memory cell M (CELL0) is at high level (H level), and the nodes A of the memory cells M (CELL11 to CELL255) are at low level (L level) (the node B is at a logic level opposite to that of the node A). If data should be read out from the memory cell M (CELL0) in this state, the following problems are posed. Note that the bit lines BL and XBL are precharged to high level at the start of access.

For example, the data ("0"-data) held in the memory cell M (CELL0) selected by setting the word line WL0 to low level is output to the bit lines BL and XBL as a read current Iread. A second leakage current Ileak flows to the transfer transistors T1 and T2 of the unselected memory cells M (CELL1 to CELL255) in accordance with the potential difference between the source and the drain or the gate potential.

A current IBL that flows to the bit line BL and a current IXBL that flows to the bit line XBL are given by $$IBL, IXBL = Iread + Ileak \times 255$$

The current IBL flowing to the bit line BL is obtained. Since no discharge from the memory cell M (CELL0) occurs, the read current Iread flowing to the transfer transistor T1 is 0. In the memory cells M (CELL1 to CELL255), the leakage current Ileak flows from the bit lines BL to the 255 memory cells M through the transfer transistors T1. Hence, the current IBL is given by $$IBL = Ileak \times 255$$

Similarly, in the bit line XBL, all the nodes B of the memory cells M (CELL1 to CELL255) are at high level, For this reason, both the nodes B and the bit line XBL (precharged) on both sides of the transfer transistors T2 have the potential VDD-α. Hence, the leakage current Ileak flowing to the transfer transistors T2 is 0. In addition, since the bit line XBL is connected to ground through the node B and driver transistor T4 of the memory cell M (CELL0), the bit line XBL that has been precharged is discharged and the read current Iread flows. Hence, the current IXBL flowing to the bit line XBL is given by $$IXBL = Iread$$

Assume that, to improve the data holding characteristics of the memory cells M, the voltage VDD-α is controlled to be relatively low, and the second leakage current Ileak is set to a value much larger than that of the first leakage current. If Iread<Ileak×255, the bit line BL changes to low level earlier than the bit line XBL that should be changed to low level by the read operation. Hence, the read operation cannot be normally executed. Additionally, the sense amplifier SA must be activated after the amplitude of the bit lines BL and XBL sufficiently increases. If the potentials of the bit lines BL and XBL are unstable due to the second leakage current Ileak, as described above, the activation timing of the sense amplifier SA must be set with a margin. This impedes the speed of read operation increasing.

2. Increase in Probability of Write Error

FIG. 7 is a view showing the schematic arrangement of the memory cell array of the conventional 4Tr SRAM and a leakage current in write operation.

FIG. 7 shows a more simplified arrangement of the memory cell array of the 4Tr SRAM shown in FIG. 6. The same reference numerals as in FIG. 6 denote parts having the same functions in FIG. 7, and a description thereof will be omitted. Assume a case wherein "1"-data is written in an arbitrary memory cell M (CELLn) (n is one of 1 to 255) except the memory cell M (CELL0), as shown in FIG. 7. The memory cell M (CELL0) holds "0"-data. The node A is at high level, and the node B is at low level.

First, to write "1"-data in the memory cell M (CELLn), the bit line BL changes to low level. At this time, if a leakage current readily flows to the transfer transistor T1 of the memory cell M (CELL0) as an unselected cell, the second leakage current Ileak is generated from the node A of the memory cell M (CELL0) to the bit line BL. Accordingly, the potential (high level) of the node A of the memory cell M (CELL0) may decrease, and the data to be held may be lost.

3. Increase in Standby Current

During the non-access period (standby period) except the above-described access period (read and write operations), the signal level of the word lines WL connected to all the memory cells M is set to VDD-α, and both the bit lines BL and XBL are set to high level. At this time, since a leakage current flows to the transfer transistor T1 or T2, the data can be held. However, power consumption increases. That is, the standby current increases.

SUMMARY OF THE INVENTION

It is an object of the present invention to provide a static semiconductor memory device which improves the data holding characteristics of a 4Tr SRAM, increases the read speed, decreases write errors, and reduces the standby current, and a method of controlling the same.

The present invention has been made to solve the above-described problems, and in a static semiconductor memory device according to the present invention and the method of controlling the device, a static semiconductor memory device having memory cells each formed from four transistors and comprising a word line selecting circuit which decodes an address for specifying a memory cell and outputs a select signal to select a word line is characterized in that the potential of the word line is controlled on the basis of a control signal for controlling a voltage value representing that the word line is unselected and a select signal output from the word line selecting circuit in each of the access mode and non-access mode for the memory cell.

In the static semiconductor memory device and the method of controlling the device according to the present invention, the voltage value representing that the word line connected to the memory cell formed from four transistors is controlled in each of the access mode and non-access mode for the memory cell, thereby adjusting the leakage current between the memory cell and a bit line in each of the access mode and non-access mode. For this reason, the data holding characteristics can be improved, the read speed can be increased, write errors can be suppressed, and the standby current can be reduced.

BRIEF DESCRIPTION OF THE DRAWINGS

FIG. 1 is a block diagram showing the schematic arrangement around the memory cell array of a 4Tr SRAM according to the first embodiment of the present invention;

FIG. 4 is a view showing a circuit example of the word line control circuit 13 shown in FIG. 1 corresponding to the second embodiment described above;

DETAILED DESCRIPTION OF THE PREFERRED EMBODIMENTS

The embodiments of the present invention will be described below.

The schematic arrangement of circuits around the memory cell array of a 4Tr SRAM (Static Random Access Memory) according to an embodiment of the present invention will be described first with reference to the accompanying drawings.

FIG. 1 is a block diagram showing the schematic arrangement around the memory cell array of a 4Tr SRAM according to an embodiment of the present invention. Referring to FIG. 1, a 4Tr SRAM 1 has a memory cell array constituted by arraying static memory cells M each formed from four transistors T1 to T4 (to be described later) in a matrix. The 4Tr SRAM 1 stores "0"-data or "1"-data in the memory cell M designated by an address.

Figure 6:
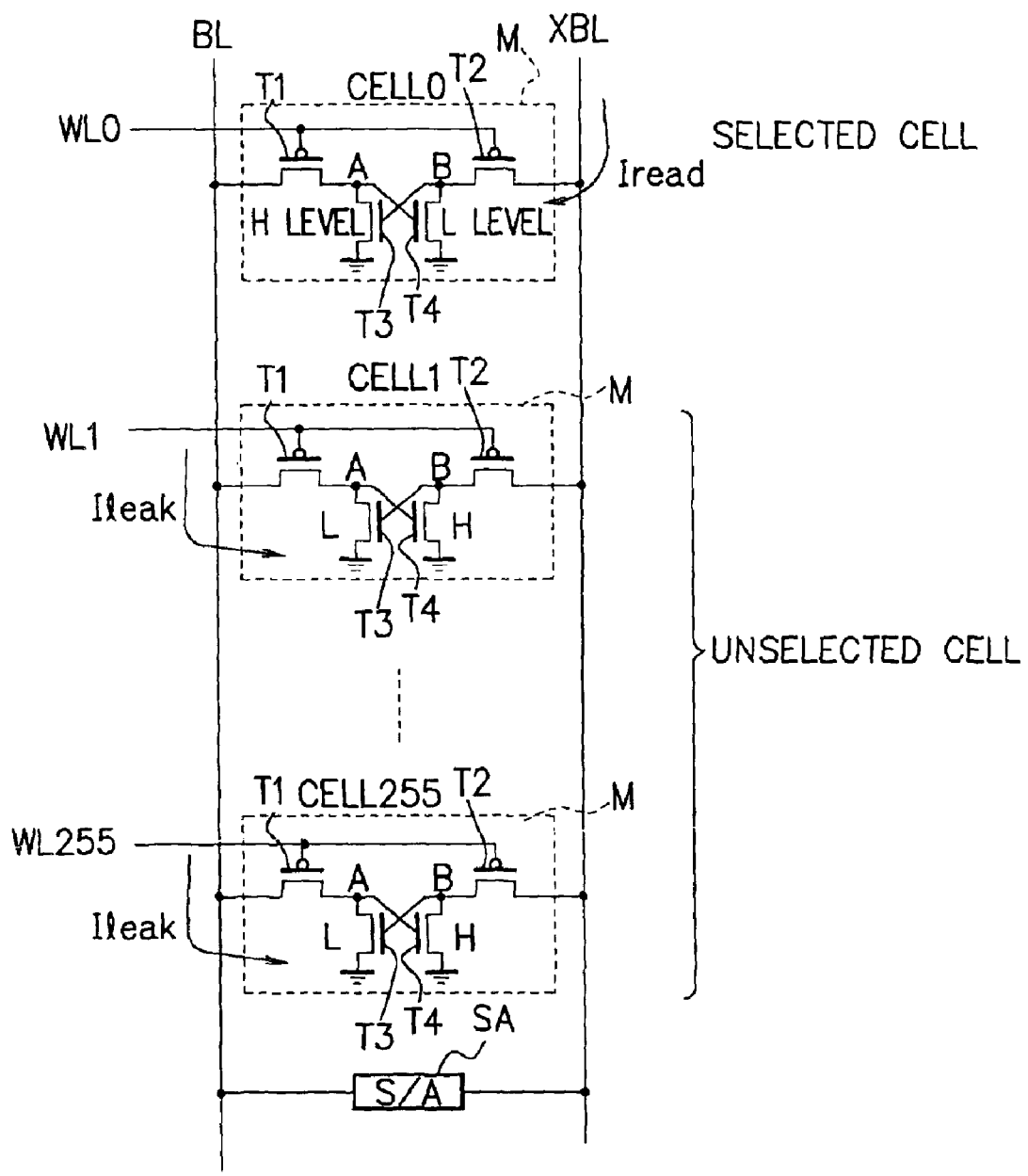
FIG. 6 is a view showing the schematic arrangement of the memory cell array of a conventional 4Tr SRAM and a leakage current in read operation.

The memory cells M, word lines WL, bit lines BL and XBL, and a sense amplifier SA shown in FIG. 1 have the same arrangements as those of the memory cells M, word lines WL, bit lines BL and XBL, and sense amplifier SA shown in FIG. 6, and a description thereof will be omitted. Arbitrary general circuits may be used as circuits other than those around the memory cell array of the 4Tr SRAM 1.

A main decoder 11 decodes an externally input address and outputs select signals WLDEC0, WLDEC1, . . . , WLDEC255 (to be referred to as select signals WLDEC hereinafter) to select the word lines WL connected to the specific memory cells M. The select signal WLDEC changes to high level in a selected mode and low level in an unselected mode. More specifically, a select signal WLDECn (n is one of 0 to 255) which selects the memory cell M to be accessed changes to high level, and the select signals WLDEC which select the memory cells M not to be accessed remain low level.

A control signal generating circuit 12 outputs a control signal φ that controls whether the high-level voltage value of the word line WL should be set to VDD (first voltage value) or VDD-α (second voltage value) when the select signal WLDEC is at low level (unselected). The control signal φ changes to low level in the non-access mode of the memory cell M and high level in the access mode. As described above, in this embodiment, the voltage value that represents that the word line WL is unselected is a high-level voltage value.

Word line control circuits 13 are inserted between the output lines (signal lines that transmit the select signals WLDEC0 to WLDEC255) of the main decoder 11 and the word lines WL (WL0 to WL255), respectively. Each word line control circuit 13 controls the signal level (logic level and voltage value) of a corresponding one of the word lines WL on the basis of the select signal WLDEC output from the main decoder 11 and the control signal φ output from the control signal generating circuit 12. More specifically, the word line control circuits 13 control the word lines WL to high/low level in accordance with the high/low level of the select signal WLDEC. That is, the word line control circuits 13 change only the word line WL selected to access the specific memory cell M to low level.

When the word lines WL are controlled to high level, the word line control circuits 13 control the high-level voltage value of the word lines WL to VDD/VDD-α in accordance with the high/low level of the control signal φ. In the access mode described above, the high-level voltage value of unselected word lines WL is controlled. In the non-access mode, the high-level voltage value of all the word lines WL is controlled.

As the first embodiment, the operation of the word line control circuits 13 will be described assuming that the control signal φ changes to high level in the access mode and low level in the non-access mode in accordance with a change in select signals WLDEC. In the non-access mode of the memory cells M, the word line control circuits 13 change the high-level voltage value of the word lines WL to VDD-α. In the access mode of the specific memory cell M (while the selected word line WL is set to low level), the word line control circuits 13 change the high-level voltage value of the unselected word lines WL to VDD.

As the second embodiment, the operation of word line control circuits 13 will be described assuming that a control signal φ changes to low level in the access mode and, in the non-access mode, periodically change to high level during a predetermined period. In the non-access mode of the memory cells M, the word line control circuits 13 periodically changes the high-level voltage value of a word lines WL from VDD to VDD-α during a predetermined period. In the access mode of the specific memory cell M (while the selected word line WL is set to low level), the word line control circuits 13 fix the high-level voltage value of the unselected word lines WL to VDD.

A circuit example of the word line control circuit 13 corresponding to the above-described first embodiment will be described next with reference to the accompanying drawings. The above-described second embodiment will be described later in detail.

Figure 2:
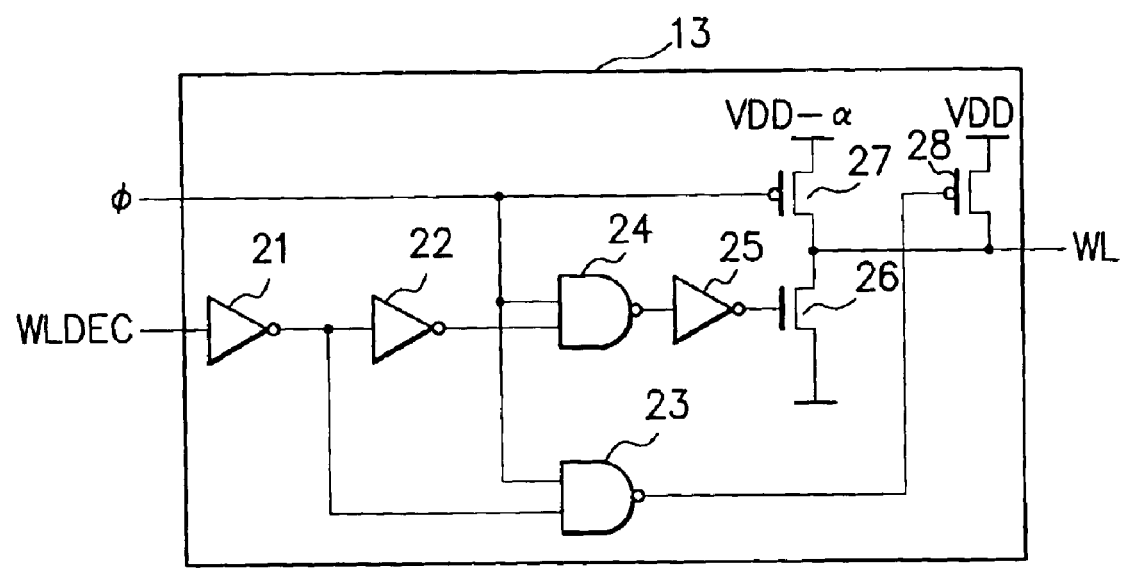
FIG. 2 is a view showing a circuit example of a word line control circuit 13 shown in FIG. 1 corresponding to the first embodiment described above.

FIG. 2 is a view showing a circuit example of the word line control circuit 13 shown in FIG. 1 corresponding to the first embodiment described above. As shown in FIG. 2, the word line control circuit 13 is constituted by inverters 21, 22, and 25, NAND circuits 23 and 24, n-MOSFET 26, and p-MOSFETs 27 and 28. The signal line that transmits the select signal WLDEC is connected to the input terminal of the inverter 22 and one input terminal of the NAND circuit 23 through the inverter 21. The signal line that transmits the control signal φ is connected to the other input terminal of the NAND circuit 23, one input terminal of the NAND circuit 24, and the gate terminal of the p-MOSFET 27. The output terminal of the inverter 22 is connected to the other input terminal of the NAND circuit 24.

The output terminal of the NAND circuit 23 is connected to the gate terminal of the p-MOSFET 28. The output terminal of the NAND circuit 24 is connected to the gate terminal of the n-MOSFET 26 through the inverter 25. The source terminal of the p-MOSFET 27 is connected to a power supply line that supplies the power supply voltage VDD-α. The source terminal of the p-MOSFET 28 is connected to a power supply line that supplies the power supply voltage VDD. The drain terminal of the p-MOSFET 27 is connected to that of the n-MOSFET 26. The source terminal of the n-MOSFET 26 is connected to ground. The connection point between the drain terminal of the p-MOSFET 27 and that of the n-MOSFET 26 is connected to the word line WL. The drain terminal of the p-MOSFET 28 is also connected to the word line WL.

The operation of the 4Tr SRAM 1 having the word line control circuit 13 according to the above-described first embodiment will be described next.

Figure 3:
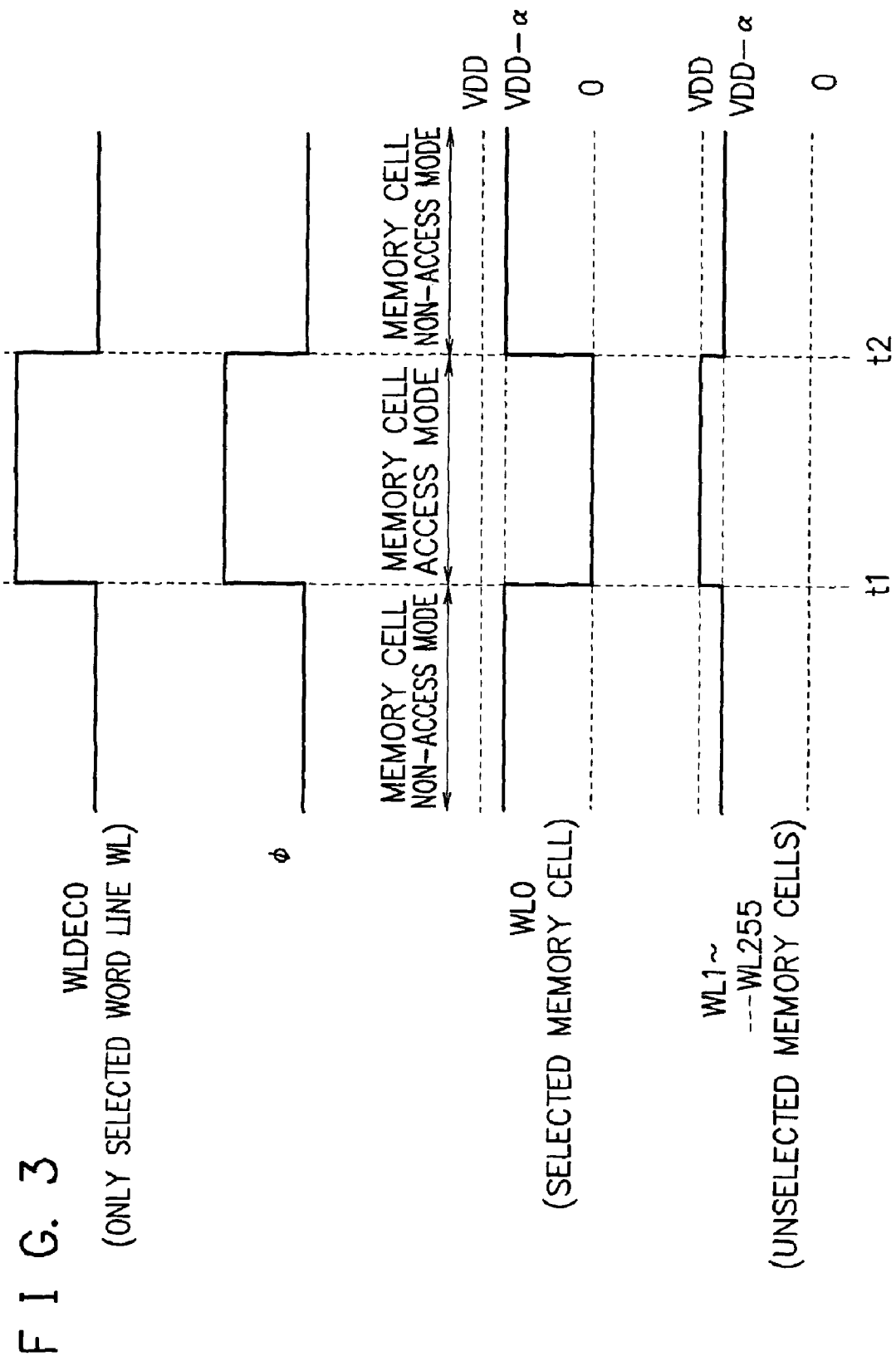
FIG. 3 is a waveform chart showing the operation of a 4Tr SRAM having the word line control circuit 13 of the first embodiment shown in FIG. 1.

FIG. 3 is a waveform chart showing the operation of the 4Tr SRAM 1 having the word line control circuit 13 of the first embodiment shown in FIG. 1. A case wherein the memory cell M (CELL0) shown in FIG. 1 is accessed will be described below with reference to FIG. 3. As shown in FIG. 3, in accessing the memory cell M (CELL0), the main decoder 11 changes the select signal WLDEC0 of the signal line connected to the selected word line WL0 to high level only during the access period for the memory cell M (CELL0) and normally sets the select signals WLDEC1 to WLDEC255 of the signal lines connected to the remaining word lines WL1 to WL255 to low level. The control signal generating circuit 12 changes the control signal φ to high level only in the access mode.

The operation of the word line control circuit 13 at this time will be described with reference to FIG. 2. In the non-access mode (before t1 or after t2 in FIG. 3), all the select signals WLDEC are at low level. In the word line control circuit 13, the inverter 21 outputs a high-level signal, and the inverter 22 outputs a low-level signal. Since the control signal φ is at low level, the NAND circuit 23 outputs a high-level signal to turn off the p-MOSFET 28. Since the NAND circuit 24 outputs a high-level signal, and the inverter 25 outputs a low-level signal, the n-MOSFET 26 is turned off. The p-MOSFET 27 whose gate terminal directly receives the control signal φ is turned on. Accordingly, the power supply voltage VDD-α is supplied to the word line WL as a high-level signal. As described above, in the non-access mode, all the word line control circuits 13 control all the word lines WL to high level (VDD-α).

In the access mode (from t1 to t2 in FIG. 3), only the select signal WLDEC0 is at high level. In the word line control circuit 13 connected to the word line WL0, the inverter 21 outputs a low-level signal, and the inverter 22 outputs a high-level signal. Since the control signal φ also changes to high level, the NAND circuit 23 outputs a high-level signal to turn off the p-MOSFET 28. Since the NAND circuit 24 outputs a low-level signal, and the inverter 25 outputs a high-level signal, the n-MOSFET 26 is turned on. The p-MOSFET 27 whose gate terminal directly receives the control signal φ is turned off. Accordingly, the word line WL0 is connected to ground and receive a voltage of 0 V.

In the access mode, the select signals WLDEC at low level and the control signal φ at high level are input to the word line control circuits 13 connected to the word lines WL1 to WL255 except the word line WL0. In the word line control circuits 13 connected to the word lines WL1 to WL255, the inverter 21 outputs a high-level signal, and the inverter 22 outputs a low-level signal. Since the control signal φ changes to high level, the NAND circuit 23 outputs a low-level signal to turn on the p-MOSFET 28. Since the NAND circuit 24 outputs a high-level signal, and the inverter 25 outputs a low-level signal, the n-MOSFET 26 is turned off. The p-MOSFET 27 whose gate terminal directly receives the control signal φ is turned off. Accordingly, the power supply voltage VDD is supplied to the word lines WL1 to WL255 as a high-level signal.

Figure 7:
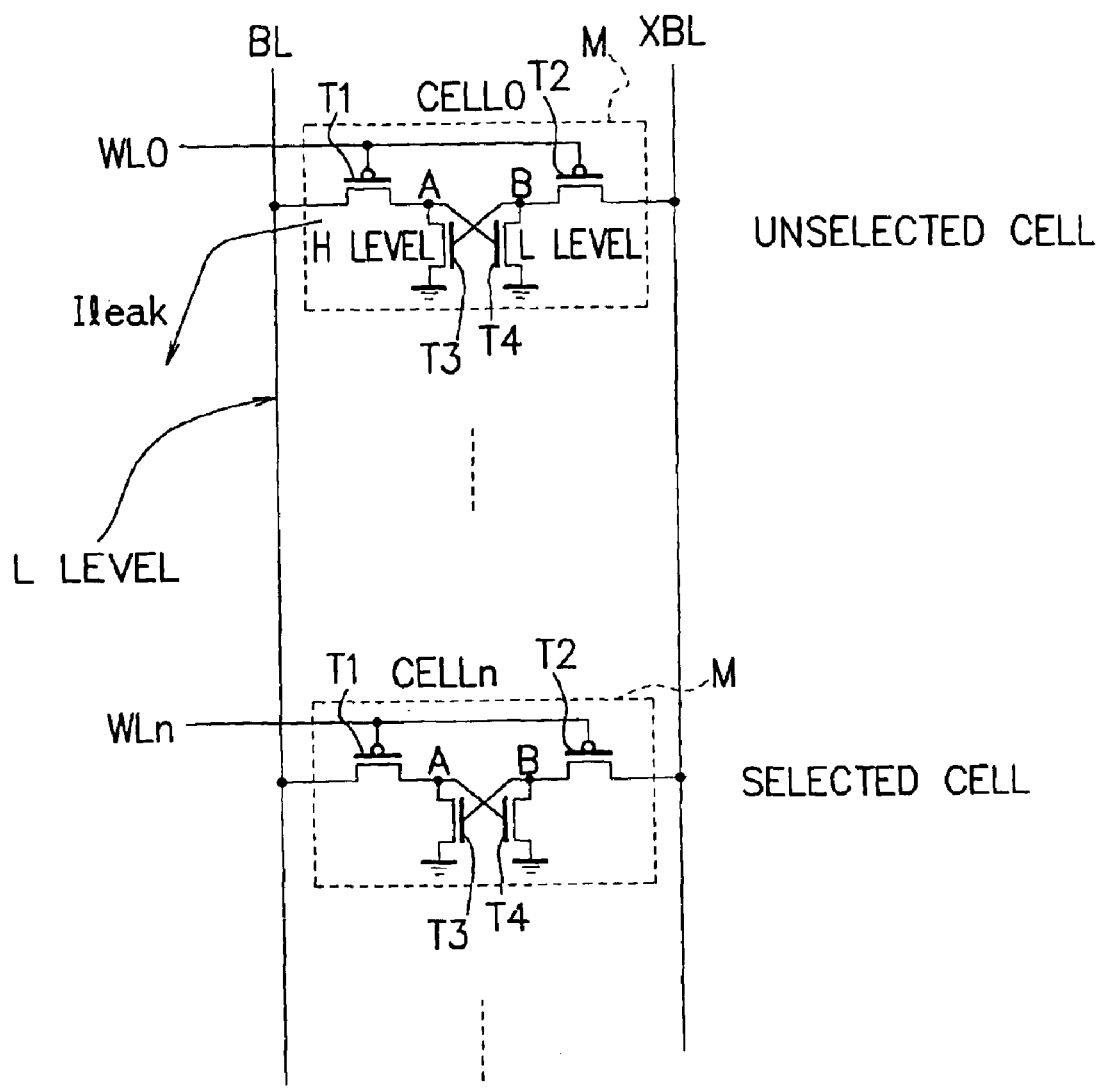
FIG. 7 is a view showing the schematic arrangement of the memory cell array of a conventional 4Tr SRAM and a leakage current in write operation.

As described above, in the access mode, the word line control circuit 13 connected to the selected word line WL0 controls it to low level (0 V). In the access mode, the word line control circuits 13 connected to the unselected word lines WL1 to WL255 control them to high level (VDD). Accordingly, when the unselected word lines WL1 to WL255 during the access period are set to have the high-level voltage value VDD, the second leakage current in the transfer transistors T1 and T2 of the memory cells M (CELL1 to CELL255) can be reduced (as compared to a case wherein the high-level voltage value of the word lines WL1 to WL255 is VDD-α). That is, the problem described with reference to FIGS. 6 and 7, i.e., the undesirably large second leakage current due to the high-level voltage value VDD-α of the unselected word lines WL during the access period can be solved.

A circuit example of the word line control circuit 13 corresponding to the above-described second embodiment will be described next with reference to the accompanying drawings. The second embodiment is different from the first embodiment in that the voltage value (high level) of the word line WL is controlled during the non-access period of a memory cell. This implements reduction of leakage current in the standby mode, which cannot be achieved by the first embodiment.

FIG. 4 is a view showing a circuit example of the word line control circuit 13 shown in FIG. 1 corresponding to the second embodiment described above. As shown in FIG. 4, the word line control circuit 13 is constituted by a NOR circuit 41, inverters 42 and 43, n-MOSFET 44, and p-MOSFETs 45 and 46. The signal line that transmits the select signal WLDEC is connected to one input terminal of the NOR circuit 41 and the gate terminal of the n-MOSFET 44. The signal line that transmits the control signal φ is connected to the other input terminal of the NOR circuit 41 and to the gate terminal of the p-MOSFET 46 through the inverter 43. The output terminal of the NOR circuit 41 is connected to the gate terminal of the p-MOSFET 45 through the inverter 42.

The source terminal of the p-MOSFET 45 is connected to a power supply line that supplies the power supply voltage VDD. The drain terminal of the p-MOSFET 45 is connected to that of the n-MOSFET 44. The source terminal of the n-MOSFET 44 is connected to ground. The connection point between the drain terminal of the p-MOSFET 45 and that of the n-MOSFET 44 is connected to the word line WL. The source terminal of the p-MOSFET 46 is connected to a power supply line that supplies the power supply voltage VDD-α. The drain terminal of the p-MOSFET 46 is also connected to the word line WL.

The operation of the 4Tr SRAM 1 having the word line control circuit 13 according to the above-described second embodiment will be described next.

Figure 5:
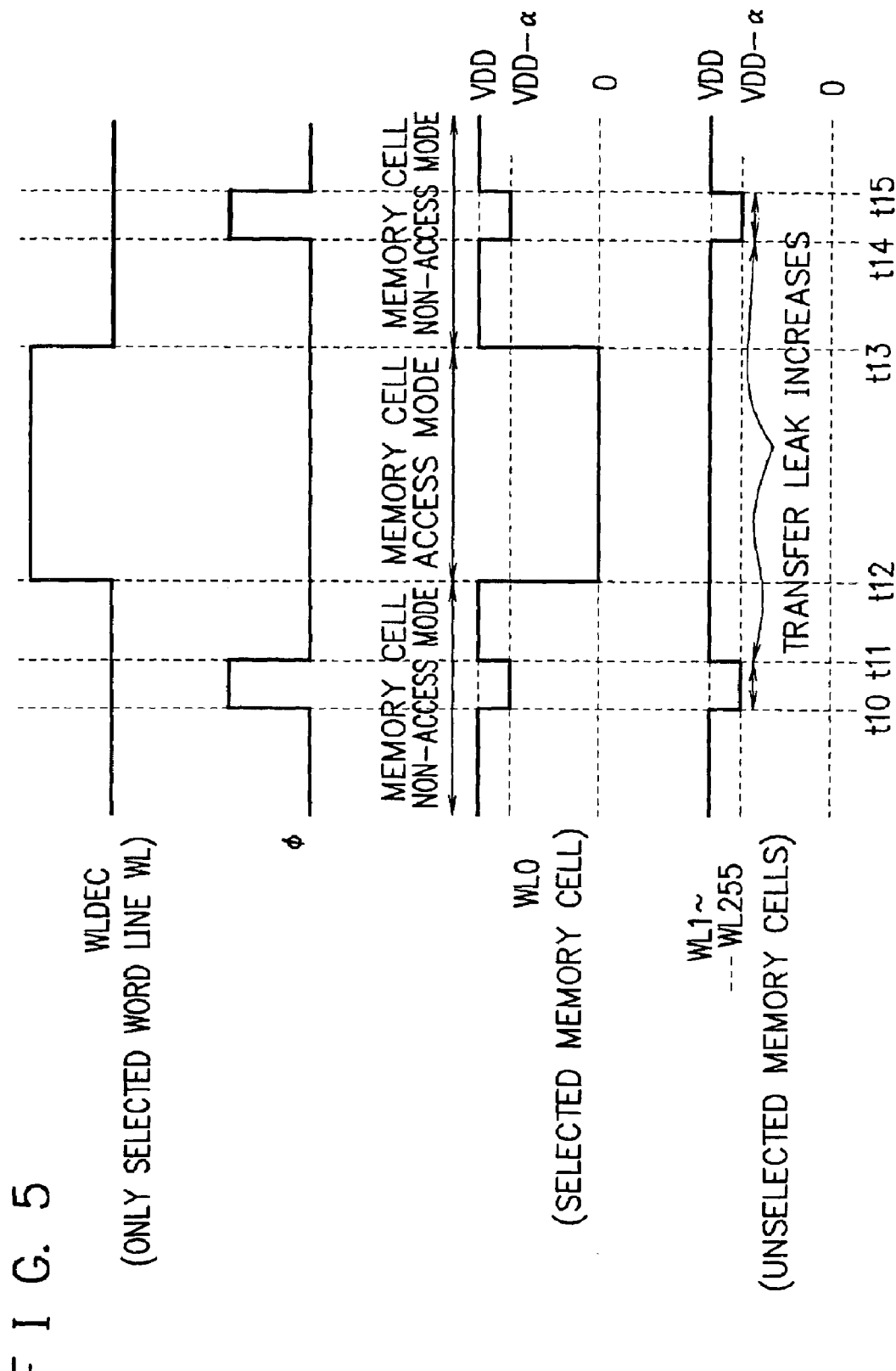
FIG. 5 is a waveform chart showing the operation of a 4Tr SRAM having the word line control circuit 13 of the second embodiment shown in FIG. 1.

FIG. 5 is a waveform chart showing the operation of the 4Tr SRAM 1 having the word line control circuit 13 of the second embodiment shown in FIG. 1. A case wherein the memory cell M (CELL0) shown in FIG. 1 is accessed will be described below with reference to FIG. 5. As shown in FIG. 5, in accessing the memory cell M (CELL0), the main decoder 11 changes the select signal WLDEC0 of the signal line connected to the selected word line WL0 to high level only during the access period for the memory cell M (CELL0) and normally sets the select signals WLDEC1 to WLDEC255 of the signal lines connected to the remaining word lines WL1 to WL255 to low level. The control signal generating circuit 12 periodically changes the control signal φ to high level during a predetermined period only in the non-access mode. The control signal generating circuit 12 sets the control signal φ to low level during a period other than that predetermined period and in the access mode.

The operation of the word line control circuit 13 at this time will be described with reference to FIG. 4. In the non-access mode (before t12 or after t13 in FIG. 5), all the select signals WLDEC are at low level. In the word line control circuit 13, the n-MOSFET 44 is turned off. The control signal φ is normally at low level and periodically changes to high level during a predetermined period (from t10 to t11 and from t14 to t15 in FIG. 5). In the non-access mode, while the control signal φ is at low level (before t10, from t11 to t12, from t13 to t14, and after t15), the NOR circuit 41 outputs a high-level signal, and the inverter 42 outputs a low-level signal, so the p-MOSFET 45 is turned on. Since the inverter 43 outputs a high-level signal, the p-MOSFET 46 is turned off. Accordingly, the power supply voltage VDD is supplied to all the word lines WL as a high-level signal.

In the non-access mode, while the control signal φ is at high level (from t10 to t11 and from t14 to t15), the NOR circuit 41 outputs a low-level signal, and the inverter 42 outputs a high-level signal, so the p-MOSFET 45 is turned off. Since the inverter 43 outputs a low-level signal, the p-MOSFET 46 is turned on. Accordingly, the power supply voltage VDD-α is supplied to the word lines WL as a high-level signal. More specifically, while the control signal φ is at high level, the voltage value of the word lines WL changes from VDD to VDD-α to increase the second leakage current of the transfer transistors T1 and T2, thereby improving the data holding characteristics in the node A or node B.

In the access mode, the select signals WLDEC of low level and the control signal φ of low level are input to the word line control circuits 13 connected to the word lines WL1 to WL255 except the word line WL0. In the word line control circuits 13 connected to the word lines WL1 to WL255, the NOR circuit 41 outputs a high-level signal, and the inverter 42 outputs a low-level signal, so the p-MOSFET 45 is turned on. Since the inverter 43 outputs a high-level signal, the p-MOSFET 46 is turned off. Accordingly, the power supply voltage VDD is supplied to the word lines WL1 to WL255 as a high-level signal.

As described above, in the access mode, the word line control circuit 13 connected to the selected word line WL0 controls it to low level (0 V). In the access mode, the word line control circuits 13 connected to the unselected word lines WL1 to WL255 control them to high level (VDD). Accordingly, when the unselected word lines WL1 to WL255 during the access period are set to have the high-level voltage value VDD, the second leakage current in the transfer transistors T1 and T2 of the memory cells M (CELL1 to CELL255) can be reduced (as compared to a case wherein the high-level voltage value of the word lines WL1 to WL255 is VDD-α). That is, the problem described with reference to FIGS. 6 and 7, i.e., the undesirably large second leakage current due to the high-level voltage value VDD-α of the unselected word lines WL during the access period can be solved. Even in the non-access mode, when the control signal φ is set to high level only during a minimum period necessary for holding data, any increase in power consumption due to the second leakage current can be prevented.

As described above, in the access mode for the memory cells M, the word line control circuits 13 change only the selected word line WL to low level and sets the remaining word lines WL to high level (VDD) on the basis of the select signals WLDEC and control signal φ. In the non-access mode for the memory cells M, the word line control circuits 13 set all the word lines WL to high level (VDD) and periodically sets the high-level voltage value to VDD-α during a predetermined period. The voltage value change timing to change the high-level voltage value of the word lines WL in the non-access mode to VDD-α is not limited to the above-described example. If the data of the memory cells M can be held by flowing the second leakage current during an arbitrary period, the voltage value may be changed irregularly or only during an arbitrary period. Not all the word lines but each group of arbitrary word lines may be controlled. That is, the control signal generating circuit 12 can arbitrarily set the period when the control signal φ is at high level.

In the above-described embodiments, the high-level voltage of the word line WL, which is controlled in accordance with the control signal φ, has a binary value (VDD or VDD-α). However, the present invention is not limited to this. A multilevel voltage value may be controlled by the control signal φ having one or a plurality of bits.

The embodiments of the present invention have been described above in detail with reference to the accompanying drawings. However, a detailed arrangement is not limited to the embodiments, and a design without departing from the spirit and scope of the invention is also incorporated in the invention.

As has been described above, in the static semiconductor memory device and the method of controlling the device according to the present invention, in a static semiconductor memory device having memory cells each formed from four transistors and comprising a word line selecting circuit which decodes an address for specifying a memory cell and outputs a select signal to select a word line, the potential of the word line connected to the memory cell is controlled on the basis of a control signal for controlling the voltage value representing that the word line is unselected and the select signal output from the word line selecting section in each of the access mode and non-access mode for the memory cell. Hence, the leakage current between the memory cell and a bit line can be adjusted in each of the access mode and non-access mode.

More specifically, in the access period (write processing), the data holding characteristics can be improved by controlling such that only a small leakage current flows from the bit line to unselected memory cells. During the access period (read processing), the data read time can be shortened by controlling such that only a small leakage current flows from the bit line to unselected memory cells, and thus, the influence of the leakage current from the unselected memory cells on the bit line potential is reduced. During the access period (write processing), write errors due to the leakage current flowing from the bit line to the memory cells can be suppressed by controlling such that only a small leakage current flows from the bit line to unselected memory cells. During the non-access period, the standby current can be reduced while maintaining the data holding characteristics by controlling such that an appropriate leakage current flows from the bit line to unselected memory cells.

What is claimed is:

1. A static semiconductor memory device having memory cells each formed from four transistors, comprising:

a memory cell array constituted by arraying the memory cells in a matrix;

a word line arranged in correspondence with each row of said memory cell array;

a pair of bit lines arranged in correspondence with each column of the memory cell array;

a word line selecting circuit which decodes an address for specifying the memory cell and outputs a plurality of select signals for selecting or unselecting said word lines; and a plurality of word line control circuits which control a potential of said word lines to one of at least three kinds of potentials on the basis of a control signal that changes in accordance with whether the memory cell is in an access mode or in a non-access mode, and the select signals output from said word line selecting circuit, wherein at least one of the memory cells is accessed in the access mode and any of the memory cells is not accessed in the non-access mode.

2. The device according to claim 1, further comprising a control signal generating circuit which generates the control signal for controlling the voltage value representing that said word lines are unselected in each of the access mode and non-access mode for the memory cells.

3. The device according to claim 1, wherein said word line control circuits control a logic level of said word lines in accordance with a logic level of the select signals output from said word line selecting circuit and control the voltage value of said word lines in accordance with the logic level of the control signal.

4. The device according to claim 2, wherein said word line control circuits control a logic level of said word lines in accordance with a logic level of the select signals output from said word line selecting circuit and control the voltage value of said word lines in accordance with the logic level of the control signal.

5. The device according to claim 1, wherein said word line control circuits control the voltage value representing that said word lines are unselected in accordance with a logic level of the control signal.

6. The device according to claim 2, wherein said word line control circuits control the voltage value representing that said word lines are unselected in accordance with a logic level of the control signal.

7. The device according to claim 3, wherein said word line control circuits control the voltage value representing that said word lines are unselected in accordance with a logic level of the control signal.

8. The device according to claim 1, wherein said word line control circuits control the voltage value representing that said word lines are unselected to one of a first voltage value and a second voltage value different from the first voltage value in accordance with a logic level of the control signal.

9. The device according to claim 1, wherein said word line control circuits perform control to set the voltage value representing that said word lines are unselected to a first voltage value in the access mode and the voltage value representing that said word lines are unselected to a second voltage value different from the first voltage value in the non-access mode in accordance with a logic level of the control signal.

10. The device according to claim 1, wherein said word line control circuits control the voltage value representing that said word lines are unselected to one of a first voltage value having the same voltage value as a power supply voltage and a second voltage value which has a voltage value smaller than the first voltage value and makes a second leakage current larger than a first leakage current in accordance with a logic level of the control signal.

11. The device according to claim 2, wherein said word line control circuits control the voltage value representing that said word lines are unselected to one of a first voltage value having the same voltage value as a power supply voltage and a second voltage value which has a voltage value smaller than the first voltage value, and makes a second leakage current larger than a first leakage current in accordance with a logic level of the control signal.

12. A static semiconductor memory device having memory cells each formed from four transistors, comprising:

a memory cell array constituted by arraying the memory cells in a matrix;

a word line arranged in correspondence with each row of said memory cell array;

a pair of bit lines arranged in correspondence with each column of the memory cell array;

a word line selecting circuit which decodes an address for specifying the memory cell and outputs a plurality of select signals for selecting or unselecting said word lines;

a control signal generating circuit which generates a control signal that chances in accordance with whether the memory cell is in an access mode or in a non-access mode; and a plurality of word line control circuits which control a potential of said word lines on the basis of the control signal generated by said control signal generating circuit and the select signals output from said word line selecting circuit.

wherein the memory cell has two transfer transistors whose gate terminals are connected to said word line and two driver transistors which constitute a latch to hold data, and adjusts a first leakage current in said driver transistors and a second leakage current in said transfer transistors to hold the data, and said control signal generating circuit generates the control signal for making it possible for the memory cell to hold the data by controlling the second leakage current amount in said transfer transistors during a predetermined period, and at least one of the memory cells is accessed in the access mode and any of the memory cells is not accessed in the non-access mode.

13. The device according to claim 12, wherein said word line control circuits control logic levels of said word lines in accordance with logic levels of the select signals output from said word line selecting circuit, and control the voltage values of said word lines in accordance with a logic level of the control signal.

14. The device according to claim 12, wherein said word line control circuits control the voltage value representing that said word lines are unselected, in accordance with a logic level of the control signal.

15. A method of controlling a static semiconductor memory device having memory cells each formed from four transistors, the static semiconductor memory device including a memory cell array constituted by arraying the memory cells in a matrix, a word line arranged in correspondence with each row of the memory cell array, a pair of bit lines arranged in correspondence with each column of the memory cell array, and a word line selecting circuit which decodes an address for specifying the memory cell and outputs select signals for selecting or unselecting the word lines, comprising:

the control step of controlling a potential of the word lines to one of at least three kinds of potentials on the basis of a control signal that changes in accordance with whether the memory cell is in an access mode or in a non-access mode, and the select signals output from the word line selecting circuit, wherein at least one of the memory cells is accessed in the access mode and any of the memory cells is not accessed in the non-access mode.

16. The method according to claim 15, further comprising the control signal generating step of generating the control signal for controlling the voltage value representing that the word lines are unselected in each of the access mode and non-access mode for the memory cells.

17. The method according to claim 15, wherein in the control step, a logic level of the word lines are controlled in accordance with a logic level of the select signals output from the word line selecting circuit, and the voltage value of the word lines are controlled in accordance with the logic level of the control signal.

18. The method according to claim 16, wherein in the control step, a logic level of the word lines are controlled in accordance with a logic level of the select signals output from the word line selecting circuit, and the voltage value of the word lines are controlled in accordance with the logic level of the control signal.

19. The method according to claim 15, wherein in the control step, the voltage value representing that the word lines are unselected is controlled in accordance with a logic level of the control signal.

* * * * *